US010115527B2

(12) United States Patent
Zelner et al.

(10) Patent No.: US 10,115,527 B2
(45) Date of Patent: Oct. 30, 2018

(54) THIN FILM DIELECTRIC STACK

(71) Applicant: BlackBerry Limited, Waterloo (CA)

(72) Inventors: Marina Zelner, Burlington (CA); Susan Nagy, Burlington (CA); Andrew Vladimir Claude Cervin, Burlington (CA)

(73) Assignee: BlackBerry Limited, Waterloo (CA)

( * ) Notice: Subject to any disclaimer, the term of this patent is extended or adjusted under 35 U.S.C. 154(b) by 99 days.

(21) Appl. No.: 14/642,222

(22) Filed: Mar. 9, 2015

(65) Prior Publication Data

US 2016/0268048 A1   Sep. 15, 2016

(51) Int. Cl.
*H01L 21/00* (2006.01)
*H01G 4/33* (2006.01)
*H01L 49/02* (2006.01)
*H01G 4/012* (2006.01)
*H01G 4/12* (2006.01)

(52) U.S. Cl.
CPC .............. *H01G 4/33* (2013.01); *H01G 4/012* (2013.01); *H01G 4/1227* (2013.01); *H01L 28/56* (2013.01)

(58) Field of Classification Search
CPC .......... H01L 28/56; H01G 4/33; H01G 4/012; H01G 4/1227
See application file for complete search history.

(56) References Cited

U.S. PATENT DOCUMENTS

| | | |
|---|---|---|
| 5,745,335 A | 4/1998 | Watt |
| 5,811,181 A | 9/1998 | Kijima et al. |
| 6,194,753 B1 | 2/2001 | Seon et al. |
| 6,407,929 B1 | 6/2002 | Hale et al. |
| 6,440,591 B1 | 8/2002 | Matsunaga et al. |
| 6,500,754 B1 | 12/2002 | Erb et al. |

(Continued)

FOREIGN PATENT DOCUMENTS

| | | |
|---|---|---|
| CA | 2922956 A1 | 9/2016 |
| EP | 681327 A2 | 11/1995 |

(Continued)

OTHER PUBLICATIONS

"International Search Report for PCT/CA2008/00906", dated Aug. 28, 2008, 3 pages.

(Continued)

*Primary Examiner* — Richard Booth
(74) *Attorney, Agent, or Firm* — Guntin & Gust, PLC; Mark Wilinski

(57) ABSTRACT

A system that incorporates teachings of the subject disclosure may include, for example, a fabricated thin film capacitor formed by depositing a first dielectric layer on a first electrode layer utilizing a first process that is performed at a first temperature, depositing a second dielectric layer on the first dielectric layer utilizing a second process that forms a randomly-oriented grain structure for the second dielectric layer, depositing a third dielectric layer on the second dielectric layer utilizing a third process that is performed at a second temperature and that forms a columnar-oriented grain structure for the third dielectric layer where the second temperature is higher than the first temperature, and depositing a second electrode layer on the third dielectric layer to form the thin film capacitor. Other embodiments are disclosed.

20 Claims, 6 Drawing Sheets

(56) References Cited

U.S. PATENT DOCUMENTS

| | | | |
|---|---|---|---|
| 6,777,776 B2 | 8/2004 | Hieda | |
| 6,909,589 B2 | 6/2005 | Huff | |
| 7,224,040 B2 | 5/2007 | Koutsaroff | |
| 8,154,850 B2 * | 4/2012 | Zelner | H01G 4/1227 |
| | | | 361/301.4 |
| 8,467,169 B2 | 6/2013 | Oakes et al. | |
| 8,693,162 B2 | 4/2014 | Capanu et al. | |
| 8,867,189 B2 | 10/2014 | Zelner et al. | |
| 2002/0132374 A1 | 9/2002 | Basceri et al. | |
| 2003/0133250 A1 | 7/2003 | Norga et al. | |
| 2003/0169560 A1 | 9/2003 | Welsch et al. | |
| 2004/0175585 A1 | 9/2004 | Zou et al. | |
| 2005/0064605 A1 | 3/2005 | Lee et al. | |
| 2006/0273366 A1 | 12/2006 | Ko et al. | |
| 2008/0278887 A1 | 11/2008 | Zelner et al. | |
| 2014/0042590 A1 | 2/2014 | Chen et al. | |
| 2014/0272465 A1 | 9/2014 | Lienhart et al. | |
| 2014/0339961 A1 | 11/2014 | Maejima et al. | |
| 2017/0365656 A1 | 12/2017 | Zelner et al. | |

FOREIGN PATENT DOCUMENTS

| | | |
|---|---|---|
| EP | 3067947 A1 | 9/2016 |
| JP | 2007088437 A | 4/2007 |

OTHER PUBLICATIONS

Extended European Search Report, dated Jul. 19, 2016.
Extended European Search Report, dated Jul. 19, 2016, 9 pages.
Article 94(3) EPC Communication, dated May 22, 2017, 5 pages.
European Office Action response filed Oct. 24, 2017, Application 16159278.7, 23 pages.

* cited by examiner

THIN FILM DIELECTRIC STACK

FIELD OF THE DISCLOSURE

This present invention relates, in general, to a thin film dielectric stack, and more particularly, to systems of and methods for manufacturing a thin film multilayer tunable dielectric stack.

BACKGROUND

Ferroelectric capacitors have various uses in RF systems including as voltage-tunable devices. Some benefits of ferroelectric capacitors are small size, integration of different values and functions of capacitance, and low cost. Applications for ferroelectric capacitors may include tunable filters, voltage controlled oscillators, tunable phase shifters, tunable matching networks, low-impedance power supplies, decoupling high-frequency signals at an IC bonding pad, or others. Integrated circuits including ferroelectric capacitors may, for example, be used in portable electronics for low-power wireless communication (e.g., cellular phones, pagers, PDAs, and so forth), directional antenna systems, high clock-rate microphones, miniature DC to DC converters, or other devices.

The fabrication of tunable ferroelectric capacitors can sometimes lead to undesired conditions. For example as shown in FIG. 1, a hillock that forms on a bottom electrode can cause defects and deformations resulting in a reduction in breakdown voltage of the dielectric film. As another example shown in FIG. 2, vertical dendrite growth can cause capacitor failure in the field during use.

BRIEF DESCRIPTION OF THE DRAWINGS

Reference will now be made to the accompanying drawings, which are not necessarily drawn to scale, and wherein.

DETAILED DESCRIPTION

Figure 1:
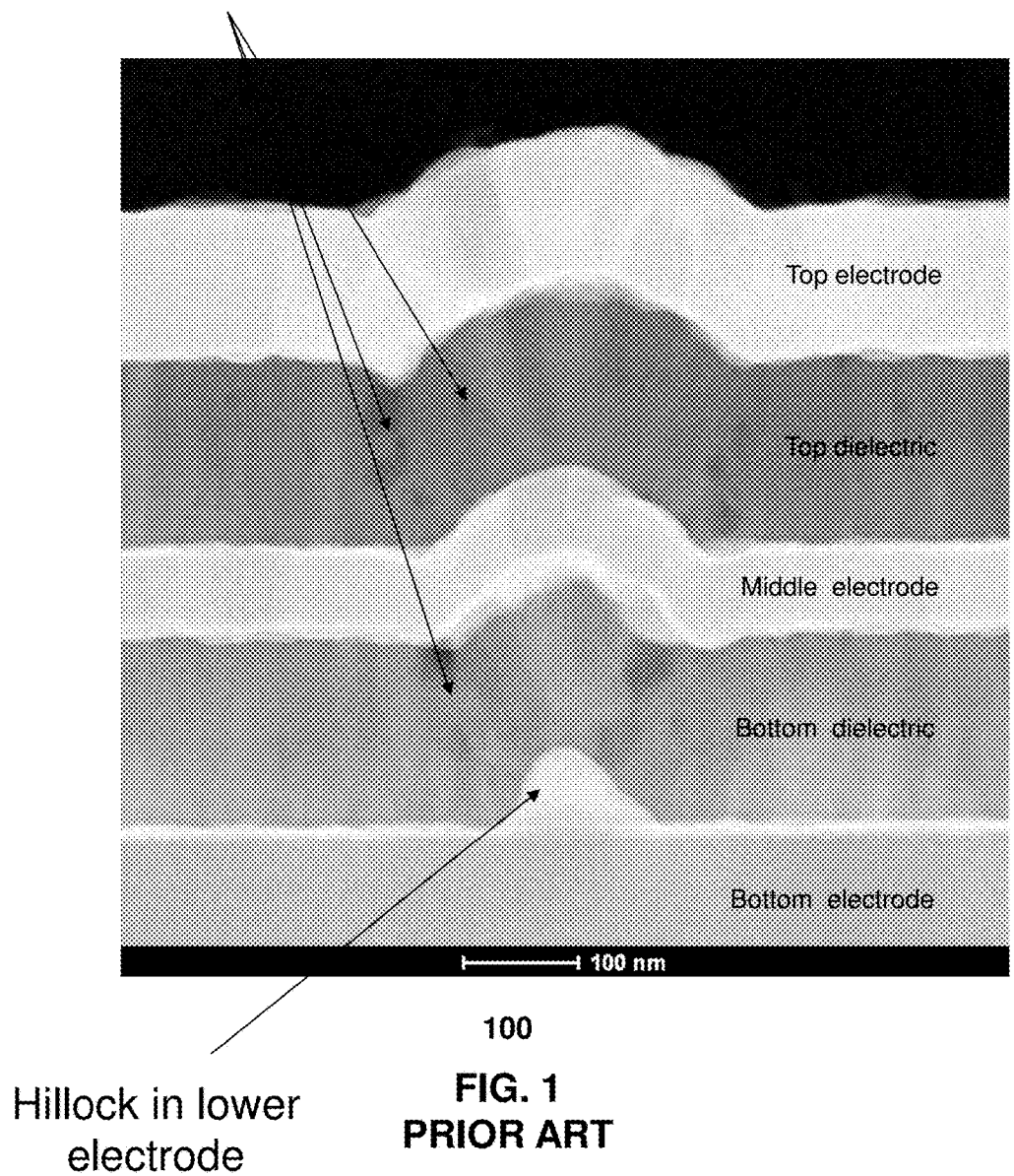
FIG. 1 illustrates an image of a prior art ferroelectric capacitor having hillock formation.
Figure 2:
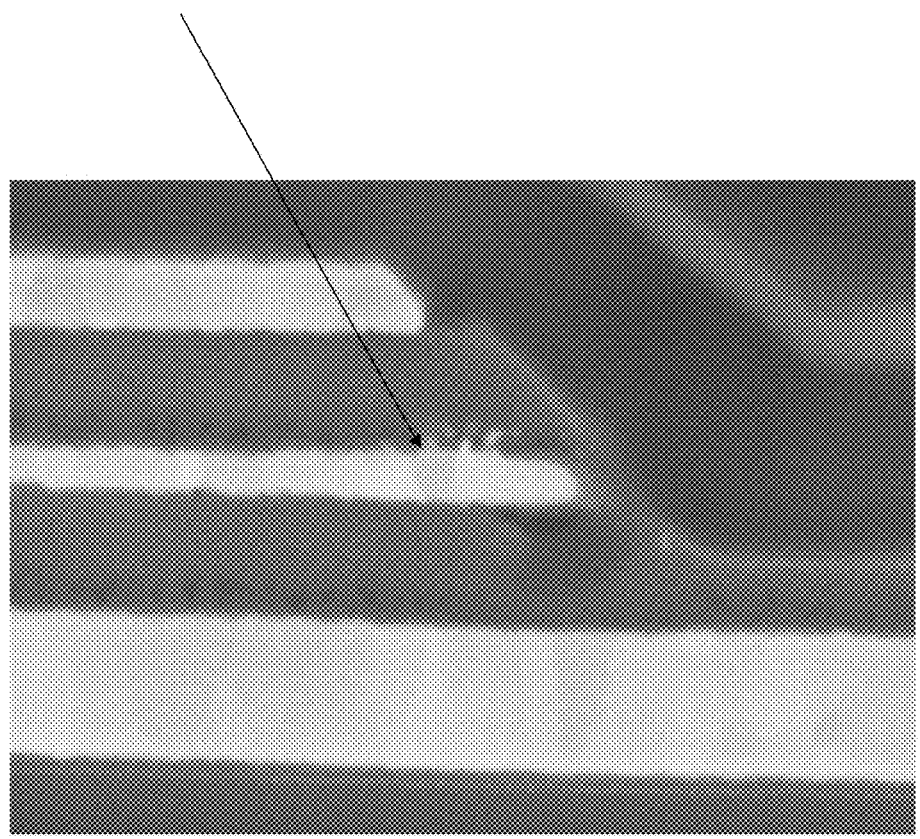
FIG. 2 illustrates an image of a prior art ferroelectric capacitor having dendrite formation.

The subject disclosure describes, among other things, illustrative embodiments of a thin film capacitor and a method of fabricating a thin film capacitor which has multiple stacked dielectric layers. The stacked dielectric layers provide for a change in grain structures in different dielectric layers to reduce or eliminate dendrite formation while maintaining a same or similar composition and grain structure at electrode interfaces to reduce or eliminate charge trapping. In one or more embodiments, low temperature deposition of some of the dielectric layers can reduce or eliminate hillock formation on the electrode(s) which could lead to low breakdown voltage. The systems and methods described herein provide a composite high-k thin film stack which improves the time-dependent dielectric breakdown of the thin film capacitor. Other embodiments are described by the subject disclosure. One or more features and/or process steps described in U.S. Pat. No. 8,154,850 can be utilized in place of or in addition to one or more features and/or process steps described herein with respect to the exemplary embodiments. The disclosure of U.S. Pat. No. 8,154,850 is incorporated herein by reference in its entirety.

One embodiment of the subject disclosure includes a method for fabricating a thin film capacitor. The method includes depositing a first dielectric layer on a first electrode layer utilizing a first process that is performed at a first temperature and depositing a second dielectric layer on the first dielectric layer utilizing a second process that forms a randomly-oriented grain structure for the second dielectric layer. The method includes depositing a third dielectric layer on the second dielectric layer utilizing a third process that is performed at a second temperature and that forms a columnar-oriented grain structure for the third dielectric layer, where the second temperature is higher than the first temperature. The method includes depositing a second electrode layer on the third dielectric layer to form the thin film capacitor.

One embodiment of the subject disclosure includes a method that includes depositing, via a first process, a first dielectric layer on a first electrode layer at a first temperature, where the first temperature is selected to be below a hillock temperature above which it is determined that hillocks form on the first electrode layer. The method can include depositing, via a second process, a second dielectric layer on the first dielectric layer to form a randomly-oriented grain structure for the second dielectric layer. The method can include depositing, via a third process, a third dielectric layer on the second dielectric layer to form a columnar-oriented grain structure for the third dielectric layer. The method can include depositing a second electrode layer on the third dielectric layer to form the thin film capacitor.

One embodiment of the subject disclosure includes a thin film capacitor including a substrate, a first electrode layer on the substrate, and a first dielectric layer on the first electrode layer, where the first dielectric layer has a columnar-oriented grain structure. The thin film capacitor can include a second dielectric layer on the first dielectric layer, where the second dielectric layer has a randomly-oriented grain structure. The thin film capacitor can include a third dielectric layer on the second dielectric layer, where the third dielectric layer has the columnar-oriented grain structure. The thin film capacitor can include a second electrode layer on the third dielectric layer, where an average grain size of the first dielectric layer is smaller than an average grain size for the third dielectric layer.

Figure 3:
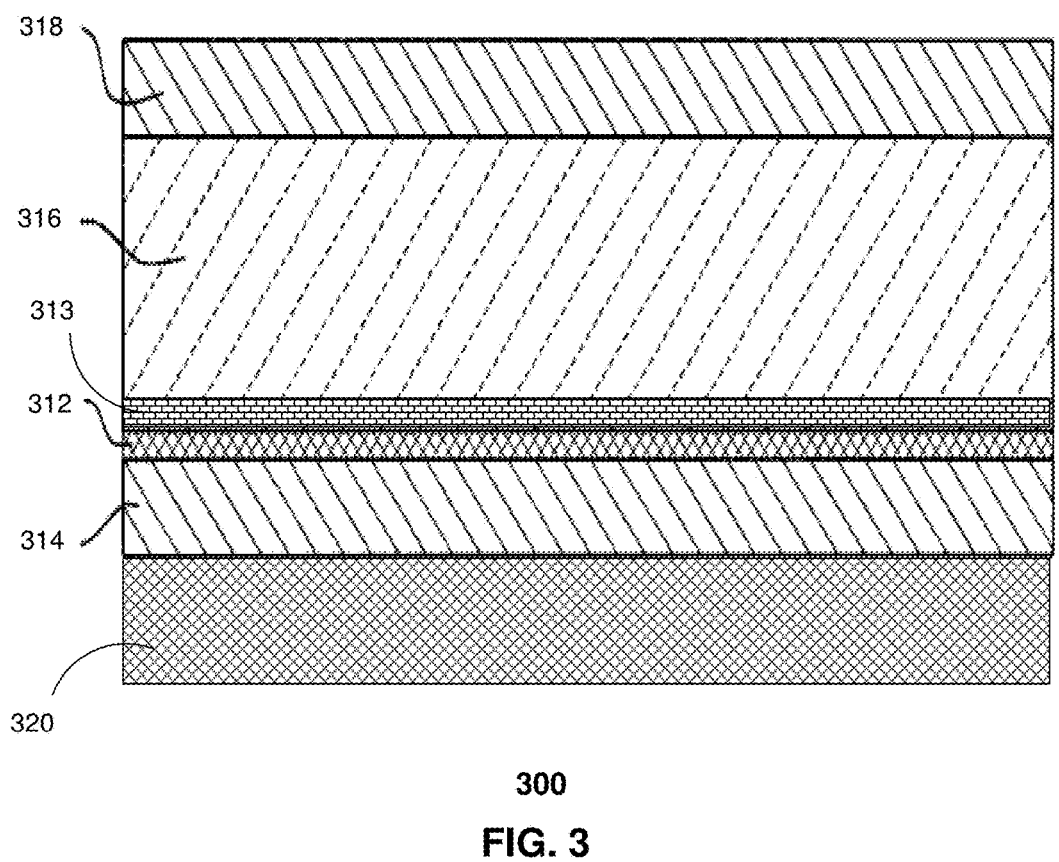
FIG. 3 illustrates an exemplary embodiment of a thin film capacitor having multiple dielectric layers.

Referring to FIG. 3, a ferroelectric capacitor 300 is illustrated that can reduce or eliminate dendrite formation and improve time-dependent dielectric breakdown, while also reducing or eliminating hillock formation along electrodes and reducing or eliminating charge trapping. Capacitor 300 can include a first dielectric layer 312, a second dielectric layer 313, and a third dielectric layer 316. The dielectric layers 312, 313, 316 can be formed directly on each other. The dielectric layers 312, 313, 316 can be formed between electrode layer 314 and electrode layer 318.

The first dielectric layer 312 can be formed of various materials including Barium Strontium Titanate (BST), Strontium Bismuth Tantalate (SBT), Lead Zirconate Titanate (PZT), Lead Lanthanum Zirconate Titanate (PLZT), any other perovskite or pyrochlore phase ferroelectric film, or a combination thereof. The first dielectric layer 312 can be formed by a process and/or formed from material(s) that enable the first dielectric layer to suppress formation of hillocks along the surface of the electrode layer 314. The first dielectric layer 312 can be formed by a process and/or formed from material(s) that provide for a particular grain habit in the first dielectric layer, such as vertically-oriented columnar grain structure.

The second dielectric layer 313 can be formed of various materials including BST, SBT, PZT, PLZT, any other perovskite or pyrochlore phase ferroelectric film, or a combination thereof. The second dielectric layer 313 can be formed by a process and/or formed from material(s) that suppress dendrite formation and/or distort the orientation of crystalline columnarity of the first layer while providing an interruption in vertically oriented grain boundaries of the capacitor resulting in an improvement in the time-dependent dielectric breakdown behavior of the capacitor. In one embodiment, the second dielectric layer 313 can be formed by a process and/or formed from material(s) that provide for a randomly-oriented grain structure in the second dielectric layer.

The third dielectric layer 316 can be formed of various materials including BST, SBT, PZT, PLZT, any other perovskite or pyrochlore phase ferroelectric film, or a combination thereof. The third dielectric layer 316 can be formed by a process and/or formed from material(s) that provide for a columnar vertically-oriented grain structure in the third dielectric layer. The third dielectric layer 316 can be formed by a process and/or formed from material(s) that enable achieving desired dielectric properties for the capacitor 300.

The electrodes 314, 318 can be formed of various materials including platinum, platinum alloy, iridium either solely or in combination with iridium oxide, ruthenium oxide, or Strontium Ruthenium Oxide (SRO), any metal or conductive oxide or any combination of these materials. The electrodes 314, 318 can be formed from other conductive materials, including non-metal conductive materials. The electrodes 314, 318 can be formed from the same material or can be formed from different materials.

The capacitor structure with multiple dielectric layers 312, 313, 316 can be formed on a substrate 320. The substrate 320 can be formed of various materials including silicon, alumina (including glazed and zirconia toughened alumina (ZTA)), sapphire, silicon-on-sapphire (SOS), silicon carbide, magnesium silicate (including foresterite), any other type of insulating, semi-insulating or semi-conducting material, or any combinations thereof. Other layers can also be included in the capacitor 300 such as an insulating layer (e.g., $SiO_2$) and/or a hermetic insulating layer ($Si_3N_4$).

In one embodiment, the first dielectric layer 312 and the third dielectric layer 316 can have the same or similar crystal grain structure and/or the same or similar dielectric composition. Space-charge effects in dielectrics can create a lack of control of the capacitance during product life under bias and losses in high frequency applications. Charge trapping can be more pronounced when the dielectric composition and/or the crystal structure habit is different on the interfaces with the upper and lower electrodes of a capacitor. The use of the same or similar dielectric composition and/or the same or similar crystal habit (e.g., columnar vertically-oriented grain structure) at the electrode interfaces in capacitor 300 can reduce or eliminate the charge trapping providing identical paths for the charge and discharge portions of the tuning cycle.

In one embodiment, the first, second and third layers 312, 313, 316 can utilize a combination of an undoped BST and a doped BST formulation, or a combination of different ferroelectric materials to facilitate reducing space charge effects and/or improving a temperature dependence of the dielectric properties of the capacitor 300. For instance, the first and third layers 312, 316 can use one of the doped or undoped BST materials while the second dielectric layer 313 uses the other of the doped or undoped BST materials.

In one embodiment, the thickness of the first dielectric layer 312 and/or the second dielectric layer 313 can be selected so that it is thin enough to not adversely affect the operation of the capacitor 300 but thick enough to enable suppression of hillock formation, suppression of dendrite formation, and/or avoid or reduce charge trapping as described herein. As an example, the overall thickness of the combination of the first and second dielectric layers 312, 313 can be less than 300 A. In one embodiment, the thickness of the first dielectric layer 312 can be different from the thickness of the second dielectric layer 313. In another embodiment, the thickness of the first and second dielectric layers 312, 313 can be the same. In yet another embodiment, the thickness of the third dielectric layer 316 can be at least two times larger than the thickness of the combination of the first and second dielectric layers 312, 313. The thicknesses selected for the first, second and third dielectric layers can be based on various factors including the dielectric material(s) being utilized, the electrode material(s) being utilized, the desired properties of the capacitor, the desired size and/or shape of the capacitor, the operating environment of the capacitor, and so forth.

Figure 4:
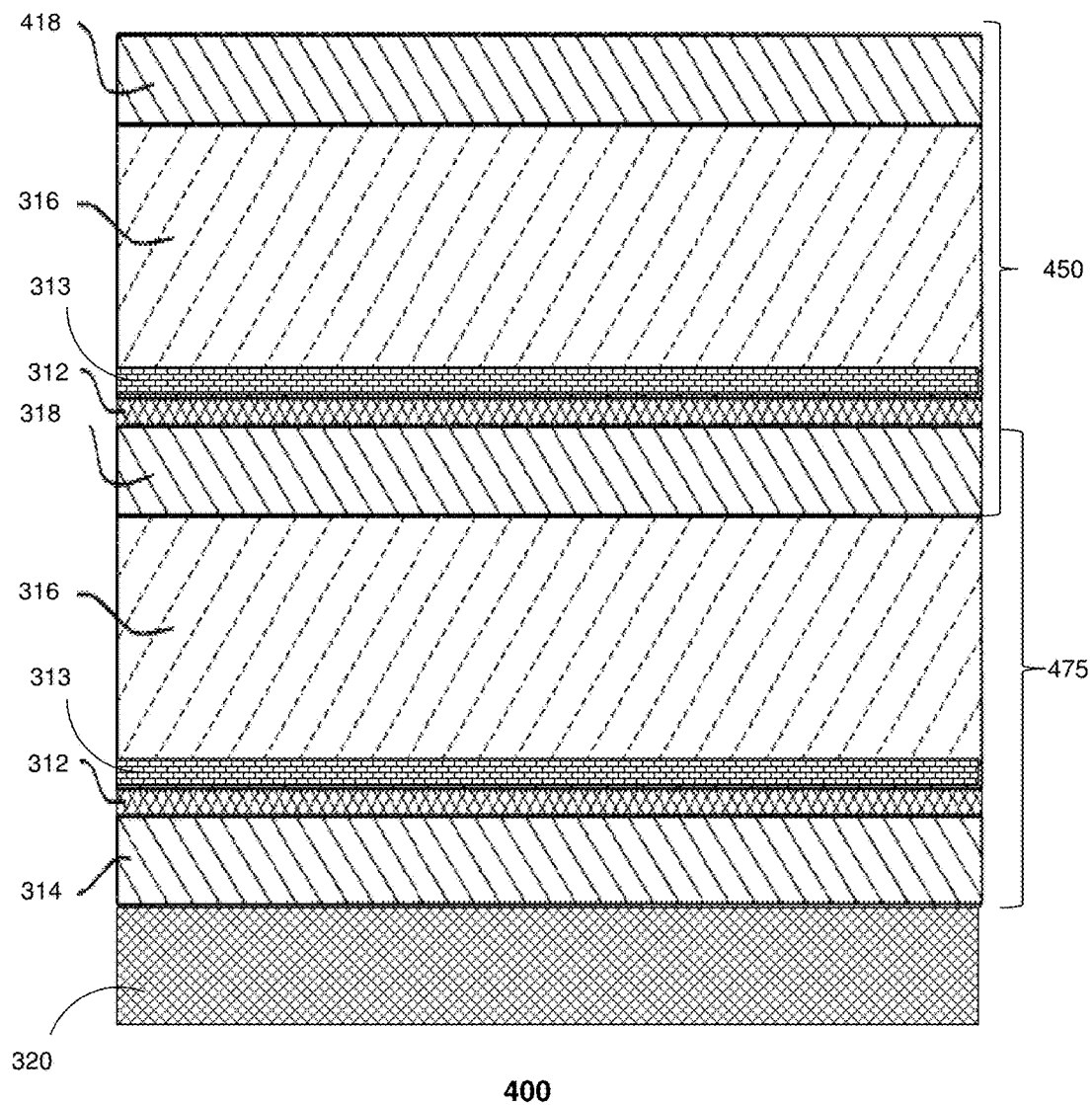
FIG. 4 illustrates another exemplary embodiment of a thin film capacitor having multiple dielectric layers.

Referring to FIG. 4, a ferroelectric capacitor 400 is illustrated that includes first dielectric layers 312, second dielectric layers 313, and third dielectric layers 316. The dielectric layers 312, 313, 316 as described above are formed by a process, formed from material(s) and/or have particular crystal grain structures which provide desired properties to the capacitor 400 including suppression of dendrite formation, suppression of hillock formation and/or improvement of time-dependent dielectric breakdown. Capacitor 400 illustrates first and second capacitors 450, 475 that are stacked together sharing a middle electrode 318 and further having a top electrode 418.

Capacitor 400 can have any number of stacked capacitors that are each formed from the dielectric layers 312, 313, 316. Any number of sets of stacked dielectric layers 312, 313, 316 can be utilized and various other connections would be implemented. In one embodiment, the sets of dielectric layers that each form capacitors 450, 475 can be the same or similar (e.g., having the same number of layers where corresponding layers in different sets have the same thickness, materials, and/or grain structure). In another embodiment, the sets of dielectric layers can have the same number of layers but corresponding layers in different sets can have the same or different thickness, materials, and/or grain structure). As an example, different capacitors stacked together may have different desired properties so that the thicknesses and/or materials forming the corresponding layers in different sets can be different. In this example, the first and third dielectric layers 312, 316 in each stacked capacitor can have the same grain structure. In another embodiment, the sets of dielectric layers can have different numbers of layers, such as a bottom capacitor having three dielectric layers (e.g., dielectric layer 316 deposited on dielectric layer 313 deposited on dielectric layer 312), a middle capacitor having five dielectric layers (e.g., dielectric layer 312 deposited on dielectric layer 313 deposited on dielectric layer 316 deposited on dielectric layer 313 deposited on dielectric layer 312), and a top capacitor having three dielectric layers (e.g., dielectric layer 316 deposited on dielectric layer 313 deposited on dielectric layer 312).

In one embodiment, the fabrication of each capacitor of the sets of capacitors (e.g., capacitors 450, 475) can be the same or similar (e.g., using the same processes for each corresponding layer in the different sets). In another embodiment, the fabrication of each capacitor of the sets of capacitors can be different (e.g., using a different process for a corresponding layer in a different set such as sputtering the first dielectric layer 312 in a bottom capacitor at a first low temperature and sputtering the first dielectric layer 312 in a middle capacitor at a second low temperature). The use of different processes to fabricate corresponding layers in different sets of capacitors can be based on various factors including desired properties of the different stacked capacitors (e.g., capacitors 450, 475).

Figure 5:
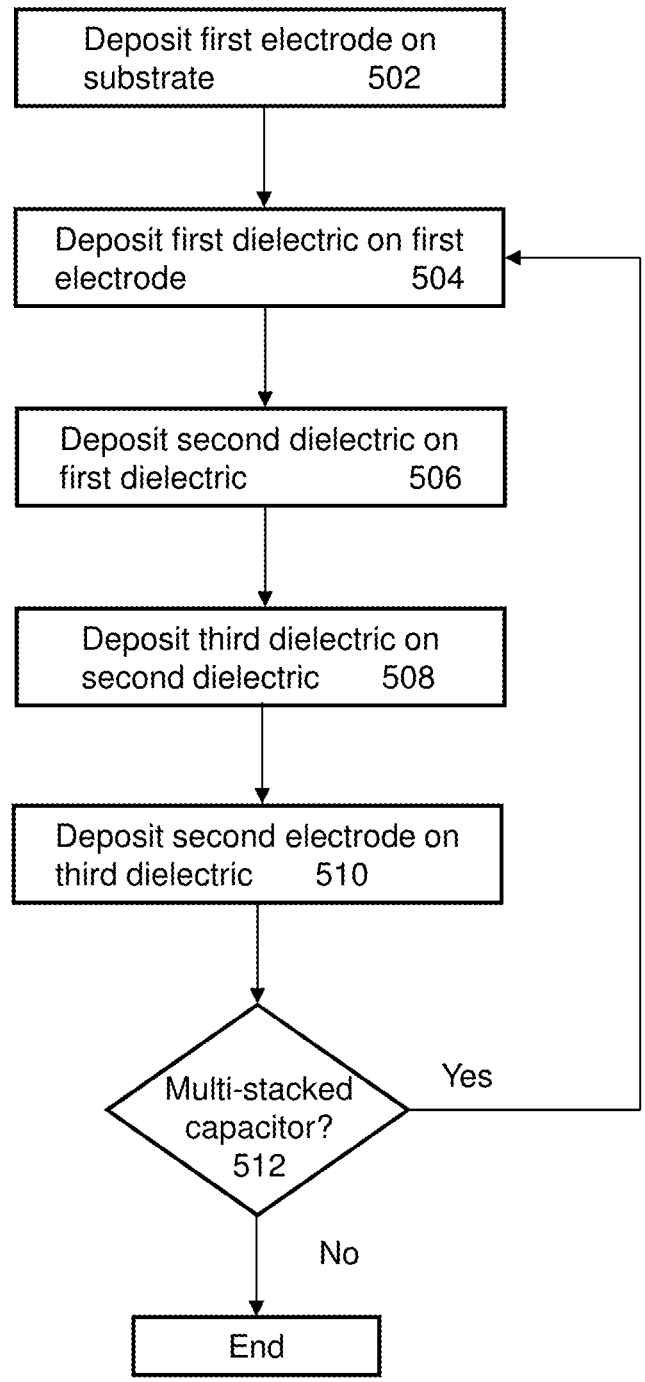
FIG. 5 illustrates an exemplary embodiment of a method of fabricating a thin film capacitor to reduce or eliminate hillock formation and/or dendrite formation and/or to improve time-dependent dielectric breakdown.

FIG. 5 depicts an illustrative method 500 for fabricating a multilayer capacitor structure. At 502, the first electrode layer 314 of conductive material may be deposited or otherwise formed. For example, the first electrode layer 314 may be deposited directly onto the substrate 320 or may be deposited onto the substrate that has previously had an insulating layer deposited thereon. The first electrode layer 314 can be formed of various materials including platinum, platinum alloy, iridium either solely or in combination with iridium oxide, ruthenium oxide, or SRO, any metal or conductive oxide, or any combination of these materials.

At 504, a first dielectric layer 312 of ferroelectric material can be deposited or otherwise formed on the first electrode layer 314. In one embodiment, the first dielectric layer 312 can be deposited directly onto the first electrode layer 314. In another embodiment, the first dielectric layer 312 can be deposited so as to cover an entire top surface of the first electrode layer 314. The first dielectric layer 312 can be formed of various materials including BST, SBT, BZN, PZT, PLZT, any other perovskite or pyrochlore phase ferroelectric film, or a combination thereof.

The first dielectric layer 312 can have a thickness between 50 A and 200 A, as well as between 200 A and 700 A. However, other thicknesses can be utilized for the first dielectric layer 312, such as based on the type of dielectric material, the parameters for the capacitor being formed, and so forth. In one embodiment, the thickness of the first dielectric layer 312 can be selected so that it is thin enough to not adversely affect the operation of the capacitor but thick enough to enable suppression of hillock formation and/or avoid or reduce charge trapping as described herein.

The first dielectric layer 312 can be a layer that suppresses formation of hillocks along the surface of the first electrode layer 314. As an example, the first dielectric layer 312 can be deposited at a temperature which is low enough to prevent or reduce hillock formation. In one embodiment, a hillock temperature can be determined for the first electrode layer 314 where the hillock temperature corresponds to the temperature above which hillock formation is likely (e.g., has been observed during testing). In this embodiment, the deposition temperature for the first dielectric layer 312 can then be chosen to be below the hillock temperature.

In one embodiment, the first dielectric layer 312 can be deposited using a process that enables a columnar-oriented grain structure to be formed, such as via a sputtering process. In another embodiment for depositing the first dielectric layer 312, a sputtering process can be performed below the hillock temperature thereby preventing or reducing hillock formation while also reducing grain growth, as compared to a high-temperature sputtering process. In one embodiment, the first dielectric layer 312 can heal and planarize possible defects and roughness in the first electrode layer 314 when applied directly to the first electrode layer.

At 506, a second dielectric layer 313 of ferroelectric material can be deposited or otherwise formed on the first dielectric layer 312. In one embodiment, the second dielectric layer 313 can be deposited directly onto the first dielectric layer 312. In another embodiment, the second dielectric layer 313 can be deposited so as to cover an entire top surface of the first dielectric layer 312. The second dielectric layer 313 can be formed of various materials including BST, SBT, BZN, PZT, PLZT, any other perovskite or pyrochlore phase ferroelectric film or a combination thereof.

The second dielectric layer 313 can have a thickness between 300 A and 500 A, as well as between 500 A and 800 A. However, other thicknesses can be utilized for the second dielectric layer 313, such as based on the type of dielectric material, the parameters for the capacitor being formed, and so forth. In one embodiment, the thickness of the second dielectric layer 313 can be selected so that it is thin enough to not adversely affect the operation of the capacitor but thick enough to enable suppression of dendrite formation and/or improvement of the time-dependent dielectric breakdown of the capacitor.

The second dielectric layer 313 can be a layer that distorts the orientation of crystalline columnarity of the capacitor while providing an interruption in the vertically oriented grain boundaries of the capacitor resulting in an improvement in the time-dependent dielectric breakdown behavior of the capacitor. As an example, the second dielectric layer 313 can be deposited utilizing a process that forms a randomly-oriented grain structure in the second dielectric layer. For instance, the second dielectric layer 313 can be deposited utilizing a Metal Organic Deposition (MOD) or Chemical Solution Deposition (CSD) process, such as spin-on deposition or misted deposition. In one embodiment, the deposition of the second dielectric layer 313 can be performed at a low temperature, such as 400 C or lower. In another embodiment, the second dielectric layer 313 can be deposited using a deposition process with a deposition temperature that is below the hillock temperature thereby preventing or reducing hillock formation while also allowing the random-oriented grain structure in the second dielectric layer.

In one embodiment, thermal processing can be applied after the deposition of the second dielectric layer 313, such as hot plate bakes, oven bakes, rapid thermal processing, vacuum bakes (e.g., in-situ bake while sputtering) and/or high temperature anneals. In one embodiment, the second dielectric layer 313 can be deposited using other processes that enable a randomly-oriented grain structure to be formed.

At 508, a third dielectric layer 316 of ferroelectric material can be deposited or otherwise formed on the second dielectric layer 313. In one embodiment, the third dielectric layer 316 can be deposited directly onto the second dielectric layer 313. In another embodiment, the third dielectric layer 316 can be deposited so as to cover an entire top surface of the second dielectric layer 313. The third dielectric layer 316 can be formed of various materials including BST, SBT, PZT, PLZT, any other perovskite or pyrochlore phase ferroelectric film or a combination thereof.

The third dielectric layer 316 can have a thickness between 300 A and 600 A, as well as between 600 A and 2000 A. However, other thicknesses can be utilized for the third dielectric layer 316, such as based on the type of dielectric material, the parameters for the capacitor being formed, and so forth. In one embodiment, the thickness of the third dielectric layer 316 can be selected so that it provides the desired parameters for the capacitor including tunability, conductivity, charge retention, grain size, and so forth.

In one embodiment, the third dielectric layer 316 can be deposited using a process that enables a columnar-oriented grain structure to be formed, such as via a sputtering process such as sputtering with RF, DC or RF/DC power source using a magnetron type cathode for plasma confinement. The deposition process can be Chemical Vapor Deposition (CVD) or Pulsed Laser Deposition (PLD) process. The sputtering process can be high temperature sputtering, such as 400 C or higher. Sputtering can be performed in a reactive environment such as in the presence of oxidizers including $O_2$, $N_2O$ or flourine.

At 510, a second electrode layer 318 of conductive material may be deposited or otherwise formed on the third dielectric layer 316. For example, the second electrode layer 318 may be deposited directly onto the third dielectric layer 316. The second electrode layer 318 can be formed of various materials including platinum, platinum alloy, iridium either solely or in combination with iridium oxide, ruthenium oxide, or SRO, any metal or conductive oxide, or any combination of these materials.

In one embodiment, the first dielectric layer 312 and the third dielectric layer 316 can have the same or similar crystal grain structure and/or the same or similar dielectric composition. Method 500 can overcome or otherwise reduce charge trapping by providing the first dielectric layer 312 and the third dielectric layer 316 with the same or similar crystal grain structure and/or the same or similar dielectric composition. In one embodiment, the deposition of the first and third dielectric layers 312, 316 can be performed using the same process (e.g., the same sputtering process) or can be performed using different processes (e.g., CVD and PLD) provided that the same or similar crystal structure is achieved for both dielectric layers (e.g., a columnar vertically-oriented grain structure).

In one embodiment, the first, second and third dielectric layers 312, 313, 316 can utilize a combination of an undoped BST and a doped BST formulation, or a combination of different ferroelectric materials to facilitate reducing space charge effects and/or improving a temperature dependence of the dielectric properties of the capacitor. For instance, the first and third layers 312, 316 can use one of the doped or undoped BST materials while the second dielectric layer 313 uses the other of the doped or undoped BST materials.

In one embodiment, the deposition of the third dielectric layer 316 can be performed at a higher temperature than the deposition of the first dielectric layer 312. For instance, the first dielectric layer 312 can be sputtered at a first temperature that is below the hillock temperature where hillock formation is likely, while the third dielectric layer 316 is sputtered at a second temperature that promotes grain growth in the third dielectric layer. As an example, where the first electrode layer 314 is platinum, the hillock temperature for the platinum electrode layer can be selected to be 600 C and the first dielectric layer 312 can be sputtered at a first temperature at or below 600 C. Other temperatures can be selected so as to reduce or eliminate hillock formation depending on the type of materials being utilized and the deposition processes being employed.

In one embodiment, the grain sizes of the first dielectric layer 312 can be smaller than the grain sizes of the third dielectric layer 316, such as an average grain size of the first dielectric layer being smaller than an average grain size of the third dielectric layer. As an example, the difference in grain sizes between the first and third dielectric layers 312, 316 can be the result of the different deposition temperatures being utilized.

At 512, the previous steps of dielectric deposition and electrode deposition can be repeated to form any number of stacked capacitors.

In one embodiment, the deposited capacitor layers may be patterned into a mesa structure. Patterning the capacitor layers into a mesa structure can provide access to all electrode layers and capacitor layers for later interconnection.

In one embodiment, a planarizing and/or insulating layer can be deposited on top of the previously deposited layers, such as over the second electrode layer 318 or over third dielectric layer 316. The planarizing and/or insulating layer can be etched to form a set of pathways or vias in the capacitor structure. These etched vias can provide conduits for metal interconnection materials to be deposited.

In one embodiment, such as following deposition and etching of the planarizing and/or insulating layer if such layer(s) are deposited, one or more metal interconnect layers can be deposited. The metal interconnect layer(s) can create electrical connections for the thin film capacitor.

In one embodiment, the electrodes can be patterned electrodes and the first, second and third dielectric layers 312, 313 and 316 are formed on the patterned electrodes. For example, the electrode layer 314 can only partially cover the substrate 320 due to patterning of the electrode layer on the substrate. In one embodiment, the dielectric layer electrode layer 314 can still completely cover the patterned electrode layer.

In one embodiment following deposition of the metal interconnect layer, an additional layer of protective material, such as a silicon nitride overcoat, may be deposited on top of the metal interconnect layer and/or gold bumps may be attached to the metal connections to help protect the previously deposited structures.

Figure 6:
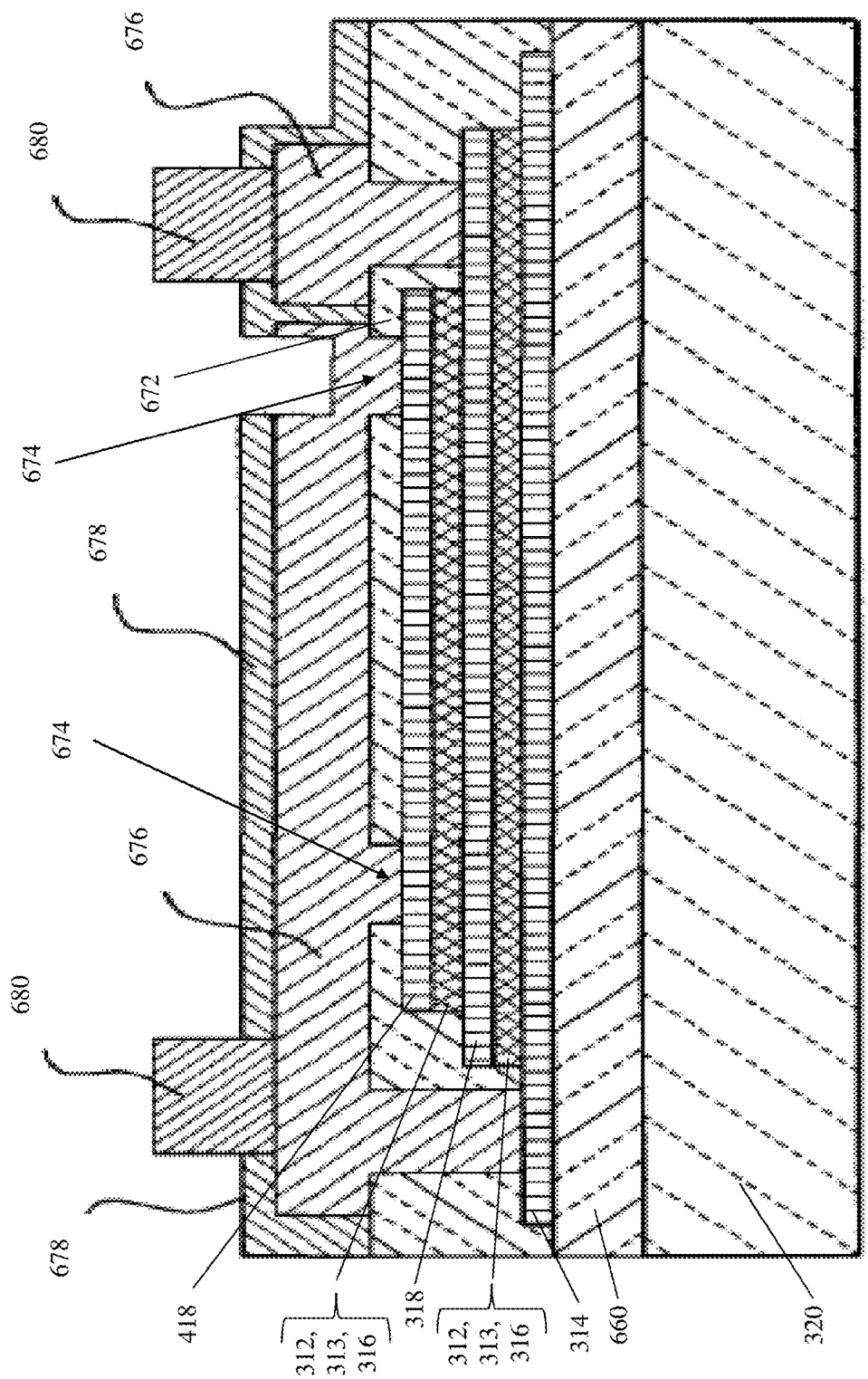
FIG. 6 illustrates another exemplary embodiment of a thin film capacitor having multiple dielectric layers.

FIG. 6 depicts a structure 600 that includes two sets of stacked dielectric layers, which in this example are dielectric layers 312, 313, 316. Any number of sets of stacked dielectric layers 312, 313, 316 can be utilized and various other connections would be implemented. In one embodiment, the dielectric layer 313 having a random-oriented grain structure is deposited between dielectric layers 312, 316 having columnar-oriented grains structures. The deposition process for the dielectric layer 312 and the dielectric layer 316 can be different, such as depositing the dielectric layer 312 at a low temperature which is below the temperature at which hillock formation occurs and depositing the dielectric layer 316 at a high temperature. Similar to the capacitor 400 of FIG. 4, the stacked capacitors in FIG. 6 share a middle electrode 318.

In one embodiment, one or more insulating layers 660 are deposited on the substrate 320. The insulating layer(s) 660 may be formed from $SiO_2$ and/or $Si_3N_4$. The sets of dielectric layers 312, 313, 316 and the electrode layers 314, 318, 418 are patterned to form a mesa structure, to facilitate providing an electrical connection to each electrode layer.

In one embodiment, a planarizing and insulating layer 672 (e.g., an ILD glass layer) can be deposited, patterned and etched to form vias 674. A metal interconnect layer 676 can be deposited over the planarizing and insulating layer 672 and into the vias 674 to provide an electrical connection to the electrodes 314, 318, 418. In one embodiment, a nitride overcoat 678 can be deposited to protect the metal interconnect layer 676 and gold bumps 680 can be deposited to provide electrical contacts for final packaging.

Upon reviewing the aforementioned embodiments, it would be evident to an artisan with ordinary skill in the art that said embodiments can be modified, reduced, or enhanced without departing from the scope of the claims described below. For example, additional dielectric layers can be added to the layer stack while configuring the stacking such that at the interface with the electrodes the same or similar crystal grain structure and/or the same or similar dielectric composition exists. For instance, a stack can be formed which is configured as follows: first dielectric layer 313 deposited on second dielectric layer 314 deposited on third dielectric layer 316 deposited on second dielectric layer 314 deposited on first dielectric layer 313. In this example, the same crystal grain structure (columnar) and the same dielectric composition (e.g., BST) exists at the electrode interfaces since it is the same first dielectric layer 313 making contact with the opposing electrodes.

Various deposition processes can be utilized for the dielectric layers in order to achieve a desired grain structure, a desired hillock suppression, a desired dendrite suppression, and/or a desired capacitor properties. For example, the deposition techniques can be sputtering, CVD, Atomic Layer Deposition (ALD), Combustion Chemical Vapor Deposition (CCVD), PLD, Physical Vapor Deposition (PVD), and so forth. In one embodiment, a sputtering target can be selected or fabricated (and utilized in one or more of the exemplary embodiments) according to one or more of the features or process steps of U.S. Patent Publication No. 20140216921, the disclosure of which is hereby incorporated by reference.

One or more of the thin film capacitors described with respect to the exemplary embodiments can be utilized in various components including tunable filters, voltage controlled oscillators, tunable phase shifters, tunable matching networks, low-impedance power supplies, decoupling high-frequency signals at an IC bonding pad, mobile phone components (where the mobile phone includes an antenna and a transceiver) or others. Integrated circuits including ferroelectric capacitors described with respect to the exemplary embodiments may, for example, be used in portable electronics for low-power wireless communication (e.g., cellular phones, pagers, PDAs, and so forth), directional antenna systems, high clock-rate microphones, miniature DC to DC converters, or other devices.

Other embodiments can be applied to the subject disclosure without departing from the scope of the claims described below.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for fabricating a thin film capacitor, the method comprising:
   determining a first temperature according to a material of a first electrode layer and according to a determination of a hillock temperature above which hillocks form on the material, wherein the first temperature is below the hillock temperature;
   determining a second temperature according to the material of the first electrode layer and according to the determination of the hillock temperature, wherein the second temperature is below the hillock temperature;
   depositing a first dielectric layer on the first electrode layer utilizing a first process that is performed at the first temperature;
   depositing a second dielectric layer on the first dielectric layer utilizing a second process that is performed at the second temperature and that forms a randomly-oriented grain structure for the second dielectric layer;
   depositing a third dielectric layer on the second dielectric layer utilizing a third process that is performed at a third temperature and that forms a columnar-oriented grain structure for the third dielectric layer, wherein the third temperature is higher than the first temperature; and
   depositing a second electrode layer on the third dielectric layer to form the thin film capacitor, wherein the first and third processes result in an average grain size of the first dielectric layer being smaller than an average grain size of the third dielectric layer.

2. The method of claim 1, wherein the first process forms a columnar-oriented grain structure for the first dielectric layer.

3. The method of claim 1, wherein a thickness of the first dielectric layer is between 50 A to 200 A.

4. The method of claim 1, wherein a thickness of the first dielectric layer is between 200 A to 700 A.

5. The method of claim 1, wherein a thickness of the first dielectric layer is between 50 A to 700 A, wherein the first and third dielectric layers are formed from the same material, and wherein the third temperature is greater than 400 C.

6. The method of claim 1, wherein a thickness of the third dielectric layer is between 300 A to 600 A.

7. The method of claim 1, wherein a thickness of the third dielectric layer is between 600 A to 2000 A.

8. The method of claim 1, wherein the first and third processes are sputtering processes, and wherein the first electrode layer is a patterned electrode that only partially covers a substrate.

9. The method of claim 1, wherein the second process is one of a metal organic deposition process or a chemical solution deposition process, and further comprising repeating the depositing of the first, second and third dielectric layers and repeating the depositing of the second electrode layer to form multi-stacked capacitors.

10. The method of claim 1, further comprising:
depositing the first electrode layer on a substrate;
depositing a metal interconnect layer to provide electrical connections for the thin film capacitor;
depositing a planarizing and insulating layer following patterning of the first, second and third dielectric layers; and
etching the planarizing and insulating layer to form vias wherein the first, second and third dielectric layers comprise barium strontium titanate.

11. A method comprising:
depositing, via a first process, a first dielectric layer on a first electrode layer at a first temperature, wherein the first temperature is selected to be below a hillock temperature above which it is determined that hillocks form on the first electrode layer;
depositing, via a second process, a second dielectric layer on the first dielectric layer at a second temperature and to form a randomly-oriented grain structure for the second dielectric layer, wherein the second temperature is selected to be below the hillock temperature;
depositing, via a third process, a third dielectric layer on the second dielectric layer at a third temperature and to form a columnar-oriented grain structure for the third dielectric layer, wherein the third temperature is above the first temperature; and
depositing a second electrode layer on the third dielectric layer,
wherein the first and third processes are sputtering processes,
wherein the second process is one of a metal organic deposition process or a chemical solution deposition process, and
wherein a thickness of the second dielectric layer is between 300 A to 800 A.

12. The method of claim 11, wherein the first process forms a columnar-oriented grain structure for the first dielectric layer.

13. The method of claim 11, wherein the thickness of the second dielectric layer is between 300 A to 500 A.

14. The method of claim 11, wherein the thickness of the second dielectric layer is between 500 A to 800 A.

15. The method of claim 11, wherein the first and third processes result in an average grain size of the first dielectric layer being smaller than an average grain size for the third dielectric layer.

16. The method of claim 11, further comprising repeating the depositing of the first, second and third dielectric layers and repeating the depositing of the second electrode layer to form first and second capacitors that are stacked on each other, wherein different first temperatures are utilized for the depositing the first dielectric layers of the first and second capacitors, wherein the first and third dielectric layers are formed from the same material, and wherein the third temperature is greater than 400 C.

17. A method for fabricating a thin film capacitor, the method comprising:
depositing a first dielectric layer on a first electrode layer utilizing a first process that forms a columnar-oriented grain structure for the first dielectric layer;
depositing a second dielectric layer on the first dielectric layer utilizing a second process that forms a randomly-oriented grain structure for the second dielectric layer;
depositing a third dielectric layer on the second dielectric layer utilizing a third process that forms another columnar-oriented grain structure for the third dielectric layer, wherein the first and third processes are selected to provide an average grain size of the first dielectric layer smaller than another average grain size for the third dielectric layer; and
depositing a second electrode layer on the third dielectric layer to form the thin film capacitor, wherein a thickness of the second dielectric layer is less than or equal to 800 A, and wherein the third dielectric layer has a thickness that is at least twice as thick as a combination of the first and second dielectric layers.

18. The method of claim 17, wherein the thickness of the second dielectric layer is between 300 A to 800 A wherein the first process is performed at a first temperature, wherein the third process is performed at a second temperature, wherein the second temperature is higher than the first temperature, and wherein the first and third dielectric layers comprise a same material.

19. The method of claim 17, wherein the thickness of the second dielectric layer is between 500 A to 800 A.

20. The method of claim 17, wherein the thickness of the second dielectric layer is between 300 A to 500 A.

* * * * *